(12) United States Patent
Fehkuhrer

(10) Patent No.: US 9,859,246 B2
(45) Date of Patent: Jan. 2, 2018

(54) METHOD FOR BONDING SUBSTRATES

(71) Applicant: EV GROUP E. THALLNER GMBH, St. Florian am Inn (AT)

(72) Inventor: Andreas Fehkuhrer, Senftenbach (AT)

(73) Assignee: EV GROUP E. THALLNER GMBH, St. Florian am Inn (AT)

( * ) Notice: Subject to any disclaimer, the term of this patent is extended or adjusted under 35 U.S.C. 154(b) by 0 days.

(21) Appl. No.: 14/917,318

(22) PCT Filed: Dec. 18, 2014

(86) PCT No.: PCT/EP2014/078585
§ 371 (c)(1),
(2) Date: Mar. 8, 2016

(87) PCT Pub. No.: WO2016/096025
PCT Pub. Date: Jun. 23, 2016

(65) Prior Publication Data
US 2016/0358881 A1    Dec. 8, 2016

(51) Int. Cl.
*H01L 21/00* (2006.01)
*H01L 23/00* (2006.01)
(Continued)

(52) U.S. Cl.
CPC .......... *H01L 24/80* (2013.01); *B32B 37/0046* (2013.01); *B32B 38/1841* (2013.01); *B32B 38/1858* (2013.01); *H01L 21/187* (2013.01); *H01L 21/304* (2013.01); *H01L 21/67092* (2013.01); *H01L 21/6831* (2013.01); *H01L 21/6835* (2013.01); *H01L 21/6836* (2013.01); *H01L 23/544* (2013.01); *H01L 24/74* (2013.01); *H01L 24/75* (2013.01); *H01L 24/94* (2013.01); *H01L 24/95* (2013.01); *H01L 24/97* (2013.01); *H01L 25/0657* (2013.01); *H01L 25/50* (2013.01); *B32B 2309/105* (2013.01); *B32B 2457/14* (2013.01); *H01L 24/08* (2013.01); *H01L 2221/68327* (2013.01);
(Continued)

(58) Field of Classification Search
CPC .................. H01L 21/76251; H01L 21/6835
See application file for complete search history.

(56) References Cited

U.S. PATENT DOCUMENTS

| 6,214,692 B1 | 4/2001 | Thallner ............... 438/401 |
| 2013/0037942 A1 | 2/2013 | Hwang et al. ........... 257/737 |

(Continued)

FOREIGN PATENT DOCUMENTS

| EP | 2 458 628 A1 | 5/2012 | |
| WO | WO 2007/047532 | 4/2007 | ........ H01L 21/30 |

(Continued)

OTHER PUBLICATIONS

International Search Report and Written Opinion from corresponding International Patent Application No. PCT/EP2014/078585, dated Dec. 4, 2015.

(Continued)

*Primary Examiner* — Richard Booth
(74) *Attorney, Agent, or Firm* — Kusner & Jaffe

(57) ABSTRACT

A method for bonding a first substrate with a second substrate, characterized in that the first substrate and/or the second substrate is/are thinned before the bonding.

15 Claims, 2 Drawing Sheets

(51) Int. Cl.
*B32B 37/00* (2006.01)
*H01L 21/18* (2006.01)
*H01L 21/304* (2006.01)
*H01L 21/67* (2006.01)
*H01L 21/683* (2006.01)
*H01L 25/065* (2006.01)
*H01L 25/00* (2006.01)
*H01L 23/544* (2006.01)
*B32B 38/18* (2006.01)

(52) U.S. Cl.
CPC ............ *H01L 2221/68363* (2013.01); *H01L 2221/68368* (2013.01); *H01L 2223/54426* (2013.01); *H01L 2223/54453* (2013.01); *H01L 2224/0224* (2013.01); *H01L 2224/0381* (2013.01); *H01L 2224/0382* (2013.01); *H01L 2224/0384* (2013.01); *H01L 2224/03831* (2013.01); *H01L 2224/08121* (2013.01); *H01L 2224/08145* (2013.01); *H01L 2224/74* (2013.01); *H01L 2224/7598* (2013.01); *H01L 2224/75251* (2013.01); *H01L 2224/75272* (2013.01); *H01L 2224/75701* (2013.01); *H01L 2224/75702* (2013.01); *H01L 2224/75704* (2013.01); *H01L 2224/75705* (2013.01); *H01L 2224/75724* (2013.01); *H01L 2224/75725* (2013.01); *H01L 2224/75734* (2013.01); *H01L 2224/75735* (2013.01); *H01L 2224/75744* (2013.01); *H01L 2224/75745* (2013.01); *H01L 2224/8001* (2013.01); *H01L 2224/8002* (2013.01); *H01L 2224/80003* (2013.01); *H01L 2224/80006* (2013.01); *H01L 2224/80011* (2013.01); *H01L 2224/8013* (2013.01); *H01L 2224/80047* (2013.01); *H01L 2224/80051* (2013.01); *H01L 2224/80093* (2013.01); *H01L 2224/80099* (2013.01); *H01L 2224/80132* (2013.01); *H01L 2224/80201* (2013.01); *H01L 2224/80203* (2013.01); *H01L 2224/80209* (2013.01); *H01L 2224/80213* (2013.01); *H01L 2224/80801* (2013.01); *H01L 2224/80894* (2013.01); *H01L 2224/80907* (2013.01); *H01L 2224/92* (2013.01); *H01L 2224/94* (2013.01); *H01L 2224/95* (2013.01); *H01L 2224/97* (2013.01); *H01L 2225/06565* (2013.01)

(56) References Cited

U.S. PATENT DOCUMENTS

| | | | |
|---|---|---|---|
| 2013/0252375 A1* | 9/2013 | Yi ........................... | H01L 24/83 438/107 |
| 2013/0328174 A1* | 12/2013 | La Tulipe, Jr. ......... | H01L 25/50 257/629 |
| 2014/0209230 A1* | 7/2014 | Wagenleitner .... | H01L 21/67092 156/60 |
| 2015/0217505 A1* | 8/2015 | Fischer ................. | G03F 7/0002 264/293 |
| 2016/0020136 A1 | 1/2016 | Thallner et al. | |

FOREIGN PATENT DOCUMENTS

| | | | | |
|---|---|---|---|---|
| WO | WO 2013/023708 | | 2/2013 | ........... H01L 21/683 |
| WO | WO 2013/182236 | | 12/2013 | ............ H01L 21/68 |
| WO | WO 2014/037044 | | 3/2014 | ................ G03F 7/00 |
| WO | WO 2014/099406 | | 6/2014 | ............ H01L 23/12 |
| WO | WO 2014/154272 | A1 | 10/2014 | |
| WO | WO 2014/202106 | | 12/2014 | ............ H01L 21/67 |
| WO | WO 2015/082020 | | 6/2015 | ............ H01L 21/67 |

OTHER PUBLICATIONS

Matthias et al., "Aligned Wafer Bonding for 3D Interconnect and Wafer-Level Layer Transfer Processes," Proceedings 2005 International Symposium on Microelectronics, Sep. 2005, pp. 6-16.

Haisma et al., "Silicon-Wafer Fabrication and (Potential) Applications of Direct-Bonded Silicon," Philips Journal of Research, 1995, pp. 65-89.

* cited by examiner

METHOD FOR BONDING SUBSTRATES

FIELD OF THE INVENTION

The invention relates to a method for bonding a first substrate to a second substrate.

BACKGROUND OF THE INVENTION

In the semiconductor industry, substrates are connected to one another permanently or temporarily by so-called bonding processes.

By a bonding process, for example, substrates with different functional units, for example substrates with memory chips and microcontrollers, can be stacked on top of one another. A substrate stack with more complex properties is obtained by the stacking and permanent attachment of multiple substrates with different properties. The thus produced substrate stacks have a thickness of a few hundred micrometers.

The bonding technology, however, can also be used for temporary attachment of a substrate and/or a substrate stack. In this case, a product substrate is attached under pressure and/or temperature by means of an adhesive to a carrier substrate. After the processing of the product substrate, the product substrate is detached again from the carrier substrate.

The greatest problem in the state of the art consists in the alignment and the permanent attachment of multiple extremely thin substrates. The stacking of such thin substrates produces a substrate stack, a so-called "multi-stack." In order to avoid the difficult and cumbersome handling of thin substrates, the alignment and bonding process is performed on substrates with a defined standard thickness. After a second substrate is bonded to a first substrate, the back-thinning of the second substrate is carried out. By the back-thinning process, a thin substrate is produced from a formerly thick substrate. Optionally, another, third, thick substrate, whose thickness is reduced in another back-thinning process, is to be bonded on this second, back-thinned substrate. Substrate stacks of any functionality can thus be produced by the process that theoretically can be repeated often at will.

One technical problem is that a permanent bond cannot be reversed, so that in the case of a misalignment and/or damage, the entire substrate stack constructed up to that point is unusable. A substrate stack that is comprised of multiple substrates can be worth tens of thousands of Euros.

SUMMARY OF THE INVENTION

This invention is based on the object of providing a method that at least partially, preferably predominantly, solves the above-mentioned problems. In addition, an object of this invention includes making possible a production of bonds that is economical and in particular as scrap-free as possible.

This object is achieved with the features of the independent claim(s). Advantageous further developments of the invention are indicated in the subclaims. Falling within the scope of the invention are also all combinations of at least two of the features indicated in the specification, the claims, and/or the figures. In the indicated ranges of values, values as boundary values that lie within the above-mentioned limits are also to be disclosed and can be claimed in any combination.

The basic idea of this invention is to back-thin at least one, and preferably all, of the substrates to be bonded, in a departure from the previous practice, before the, in particular permanent, bonding.

The invention thus relates in particular to a method for bonding already thinned substrates. In this case, the invention is preferably based on the idea of attaching—and in this state transporting, aligning and bonding—thinned substrates, preferably wafers, to a carrier, in particular a film, which was stretched on a frame (substrate attachment). The substrate is therefore thinned preferably to its intended thickness during transport, and/or alignment, and/or the bonding process. In special embodiments according to the invention, thick substrates are attached to the carrier and are back-thinned only immediately before the alignment (preferred) or immediately before the bonding, so that a transport of thicker substrates is also possible over a certain distance. Hereinafter, for the sake of simplicity, it is assumed that the substrates are already thinned at all times, unless another state is explicitly described.

In a preferred embodiment, a thinned substrate can be bonded to a substrate that is not thinned or—even more preferably—to a substrate stack. For even better avoidance of scrap-containing substrate stacks, only thinned substrates according to the invention can be bonded to one another.

According to an advantageous embodiment of the invention, the first substrate and/or the second substrate is/are thinned to a thickness of less than 1,000 μm, in particular less than 500 μm, preferably less than 100 μm, even more preferably less than 50 μm, and most preferably less than 30 μm.

In further development of this invention, it is provided that the first substrate and/or the second substrate for thinning and/or bonding is/are attached on a carrier surface of a carrier that has in particular a ring-shaped frame. In particular, when using the same carrier for thinning and bonding, an exchange of the carrier can be eliminated, so that the thin substrate always has a support, and thus wastage, in particular after thinning, is prevented.

Advantageously, according to an embodiment of this invention, it is provided that the first substrate and/or the second substrate is/are preferably completely congruent in shape, in particular at least in relation to a cross-sectional surface of the first substrate and/or the second substrate in each case parallel to a bonding surface, and/or have similar geometric dimensions. In particular, this invention is applied as a wafer-to-wafer (W2W) method, leading to advantages in terms of processing speed and throughput.

To the extent that the first substrate and the second substrate are aligned with one another and then are pre-attached, in particular magnetically, before the bonding based on corresponding alignment markings of the substrates, in particular with an alignment accuracy of better than 100 μm, preferably better than 50 μm, even more preferably better than 1 μm, most preferably better than 500 nm, and all the more preferably better than 200 nm, influences on the alignment of the carriers on one another can be virtually eliminated.

It would also be conceivable, however, that multiple small second substrates are arranged, in particular regularly, on a carrier, and in particular were also back-thinned in order to bond simultaneously to a first substrate. As a result, a die-to-wafer (D2W) method according to the invention is obtained, whereby the small substrates, following the nomenclature in the semiconductor industry, are referred to as chips (or die), although they do not necessarily have to be chips, i.e., they do not necessarily have to have an electrical functionality. The small substrates are back-thinned according to the invention, in particular before bonding.

In a special third embodiment according to the invention, even the simultaneous bonding of multiple small substrates to multiple small substrates would be possible, which would correspond to a chip-to-chip (C2C) method. The small substrates are back-thinned according to the invention in particular before the bonding.

Hereinafter, for the sake of simplicity, reference is to be made exclusively to two large substrates that are in particular congruent in shape and that are handled according to the invention.

Advantageously, thinned substrates according to the invention can be bonded directly. Even more preferably, one or more of the subsequent treatment steps is/are performed before transport and/or before alignment and/or before bonding:

Grinding, and/or
Polishing, and/or
Etching, and/or
Separating (English: dicing)
Cleaning
Coating, in particular by
  Physical methods, in particular
    PVD
  Chemical methods, in particular
    CVD, PE-CVD
Functionalizing, provided in particular with electronic structures, and/or in particular
  Enameling
  Lithography
  Embossing
  Developing
Testing.

Only intact (i.e., tested after the above-mentioned steps) thinned substrates are preferably part of a new substrate stack that is to be bonded. Thinned substrates that have defects, in particular functionalized, thinned substrates, in which a predominant part or even all functional units do not function, can be removed from the process chain. As a result, the probability that the entire substrate stack is destroyed is drastically reduced. By the process according to the invention, the destruction of the substrate stack can be carried out henceforth only in the alignment and/or bonding step. These two steps, however, are also used in the state of the art in order to produce substrate stacks and therefore do not represent any additional process steps after the bonding.

According to the invention, in particular a substrate attachment is provided, which is thus designed to attach a thinned substrate in particular to a carrier of the substrate attachment.

Types of Substrates

According to the invention, all standard types of substrates are suitable, in particular wafers. The substrates can have any shape, but are preferably circular. The diameter of the substrates is in particular industrially standardized. For wafers, the industry-standard diameters are 1 inch, 2 inches, 3 inches, 4 inches, 5 inches, 6 inches, 8 inches, 12 inches and 18 inches. The method according to the invention could also be especially advantageous for processing rectangular substrates, in particular glass or sapphire substrates.

The substrates can be semiconductor substrates, metal substrates, ceramic substrates, mineral substrates, in particular sapphire substrates, glass substrates or polymer substrates. In the case of ceramic or mineral substrates, preferably sapphire substrates are used.

According to the invention, the attachment of thinned substrates or the attachment of substrate stacks, which are built up from multiple thinned substrates that are already aligned with one another and bonded to one another, is possible. Hereinafter, therefore, substrate is also understood to be a synonym for substrate stack.

Substrate Attachment

In a further development of the invention, the substrate attachment includes a frame and an elastic film (or tape) that is stretched over the frame as a carrier.

The film forms in particular an adhesive substrate attaching surface, to which the substrate can be attached. The film represents an attaching element. The frame forms a carrier attaching surface (carrier attaching area), which in particular acts magnetically, for attaching the substrate attachment to a second, in particular corresponding, substrate attachment.

In a first preferred embodiment, the substrate attachments can therefore be attached to one another magnetically. The frame is therefore preferably magnetic or magnetizable. The magnetic flux density of the frame is in particular greater than $10^{-5}$ T, preferably greater than $10^{-4}$ T, even more preferably greater than $10^{-3}$ T, most preferably greater than $10^{-1}$ T, and all the more preferably greater than 1 T.

Advantageously, the pressure that is produced on the contact surfaces of the substrates by two frames that adhere magnetically to one another is greater than $10^{-5}$ N/m$^2$, preferably greater than $10^{-3}$ N/m$^2$, even more preferably greater than 1 N/m$^2$, most preferably greater than $10^1$ N/m$^2$, and all the more preferably greater than $10^3$ N/m$^2$.

In a second embodiment according to the invention, the substrate attachments, in particular from the outer side, can be attached to one another via clamps.

In a third embodiment according to the invention, the substrate attachments can be attached to one another via a plug-in system. The plug-in system is preferably expanded so that plug-in elements and recesses, which serve to receive the plug-in elements of the opposite substrate attachment, alternate along a periphery in its entirety.

In a fourth embodiment according to the invention, the substrate attachments can be attached to one another electrostatically. In this case, corresponding plates, which can be brought to an electrical potential, are located distributed uniformly along the substrate attachment. The plates are preferably electrically insulated by the remaining substrate attachment.

In a further development of the invention, the substrate attachment has a solid base element with in particular controllable attaching elements for attaching the substrate to a flat substrate attaching surface of the base element. In addition, the substrate attachments can be attached below one another according to the above-described embodiments according to the invention.

In a further development, the substrate attachments can be attached to one another magnetically. The base element is therefore in particular magnetic or magnetizable on its substrate attaching surface. The magnetic flux density of the base element, in particular in the carrier attaching area, is in particular greater than $10^{-5}$ T, preferably greater than $10^{-4}$ T, even more preferably greater than $10^{-3}$ T, most preferably greater than $10^{-1}$ T, and all the more preferably greater than 1 T.

Advantageously, the pressure that is produced on the contact surfaces of the substrates by two substrate attachments that adhere magnetically to one another is greater than $10^{-5}$ N/m$^2$, preferably greater than $10^{-3}$ N/m$^2$, even more preferably greater than 1 N/m$^2$, most preferably greater than $10^3$ N/m$^2$, and all the more preferably greater than $10^3$ N/m$^2$.

The attaching, in particular magnetic, properties of the base element, frame and/or substrate attachment for adhesion between two related base elements, frame and/or substrate attachment, in particular on the carrier attaching surface or a carrier attaching area, are preferably independent of the attaching properties, mentioned below, of the attaching elements for attaching substrates.

According to a first embodiment according to the invention, the attaching element is at least an adhesive surface. The adhesive surface is preferably switchable electrically and/or magnetically, so that it is possible to alternate between a state of high adhesion and a state of low adhesion, in particular by means of a control system.

In a second embodiment according to the invention, the attachment element is at least one vacuum attachment to the substrate attaching surface. The vacuum attachment preferably includes multiple vacuum feed lines, which run through the carrier surface. The vacuum feed lines are preferably connected to a vacuum chamber located in the substrate attachment or in the carrier. The vacuum chamber can be sealed via a feed line, which can be separated from the surrounding area in a fluid-dynamic manner via a valve, preferably by a control system. As a result, it is possible according to the invention to attach in particular a back-thinned substrate to the carrier surface by applying a vacuum and to close the valve during the evacuation process. As a result, a permanent underpressure is produced in the vacuum feed lines and the vacuum chamber. The normal pressure that acts from outside thus represents an overpressure relative to the underpressure area in the carrier, and the substrate thus attaches to the carrier.

In a third embodiment according to the invention, the attaching element is at least an electrostatic attachment. The electrostatic attachment is comprised in particular of multiple specially formed electrodes that are aligned and oriented to one another, on which a defined potential can be set by an electric line. In the electrically conductive areas of a substrate that is to be attached, a separation of charge, in particular an electric induction, can be produced by the generated separation of charge, which induction results in an electrostatic attraction between the carrier on the substrate attaching surface and the substrate. This can be controlled in particular by a control system.

In a fourth embodiment according to the invention, the attachment element is at least a magnetic attachment. The magnetic attachment is preferably switchable and is distinguished from the in particular permanent magnetization of the base element. The switchable magnetic attachment is preferably magnetic coils, which build up a magnetic field by a current flux for attaching the substrate to the substrate attaching surface. Accordingly, the substrate that is to be attached has at least partial magnetic properties.

In the case of a fifth embodiment according to the invention, the attaching element is at least a mechanical attachment. The mechanical attachment is comprised in particular of clamping elements. The clamping elements attach the substrate along the substrate surface that is to be bonded. The clamping elements can remain in the attaching position during the alignment process according to the invention and even also when the two substrates are being moved toward one another. The clamping elements can then be removed shortly before, during or even after the substrates make contact.

The substrate attachments thus preferably have a substrate attaching surface and a carrier attaching surface (or carrier attaching area) that surrounds the substrate attaching surface.

The substrate can be back-thinned before and/or after the attaching to the substrate attachment. If the substrate is back-thinned before the attachment to the substrate attachment, the substrate attachment is not contaminated. However, a transfer of a back-thinned substrate to the substrate attachment must then be carried out. If the substrate is back-thinned after the attachment to the substrate attachment, the substrate attachment is preferably cleaned after the back-thinning. Because of the immediate attachment of the substrate that is to be back-thinned, however, advantages of stability will emerge. In addition, there is no need for the transferring of a back-thinned substrate to the substrate attachment according to the invention.

The Process

According to a first embodiment of the process according to the invention, the two thinned substrates that are to be bonded by means of a first attachment according to the invention are arranged at a distance to one another, without the contact surfaces of the substrates first making contact or being connected temporarily (pre-bonding). The substrates are accordingly attached in each case to in particular corresponding, opposite substrate attaching surfaces of substrate attachments.

In a first process step, an alignment of two substrates to one another is carried out based on alignment markings of the substrates. Despite the alignment of the substrates, attached to the substrate attachments according to the invention, based on their alignment markings, an alignment of the substrate attachments to one another according to the invention that is not completely perfect can result if the latter are not aligned identically with the respective substrates. The alignment can be carried out, for example, with one of the attachments from U.S. Pat. No. 6,214,692 B1, PCT/EP 2013/075831 or PCT/EP 2013/062473. In the case of the alignment of multiple smaller substrates to a large substrate or the alignment of multiple smaller substrates to multiple small substrates, the alignment process can also be subject to an error minimization process, in which the optimal alignment of the substrate attachments and thus the small substrates that are located thereon is carried out by an error minimization. Such processes are described in the publication WO2013/182236A1.

In particular, the further processing is carried out when an orienting angle around the normal of the two corresponding substrate attachments to one another is in particular less than 5°, preferably less than 1°, even more preferably less than 0.1°, most preferably less than 0.01°, and all the more preferably less than 0.0001°, and/or a translatory shifting of the two corresponding substrate attachments to one another is in particular less than 5 mm, preferably less than 1 mm, even more preferably less than 100 μm, most preferably less than 1 μm, and all the more preferably less than 100 nm. The above-mentioned values can be determined with a testing system.

In a second process step according to the invention, moving the substrate attachments according to the invention toward one another is carried out. In the case of bringing objects together, optionally a continuous control of the alignment markings and/or characteristic features of the substrates to one another or to other features can be carried out, so that a continuous checking of the positions of the substrates during the bringing-together phase can take place. As a result, it is ensured that during the bringing-together phase, no shifting of the two substrates toward one another is carried out. At the end of the process step, the surfaces of the in particular magnetic substrate attachment, here the frame, make contact with the carrier attaching surfaces. The frames are attached to one another. The attachment is preferably carried out via an in particular inherent magnetization of at least one of the two frames at least on the carrier attaching surfaces. The attachment by means of an adhesive, which is applied to at least one of the carrier attaching surfaces, is also conceivable, however. Another conceivable attachment option is clamping by means of clamping elements applied on the outside.

In a third process step according to the invention, a prebonding or bonding process is carried out by bringing the two substrates toward one another, which substrates are attached to the substrate attaching surfaces on the carriers. The bonding process by moving the two substrates toward one another can also be carried out in particular by means for bringing objects together, in particular a centrically-oriented pressure device, in particular by a mandrel, from the reverse side of the substrate attachment according to the invention. Such means for bringing objects together and in particular specimen holders that were suitable for holding the substrate attachments are described in more detail in the publication PCT/EP 2011/064353.

In this embodiment, the bringing-together of objects is carried out by deformation of the carrier, in particular the film that is stretched in the frame. The film can be deformed by a centrically-oriented pressure device or by a roller of the film on the side facing away from the substrate. In the publication WO2014037044A1, a device with a roller is described, with whose help an embossing can be performed. One skilled in the art could build an attachment from the device in the publication WO2014037044A1, which attachment generates a corresponding line-shaped loading of the substrate attachment according to the invention, in particular the film, and thus initiates a corresponding contacting and/or bonding process. In special embodiments according to the invention, it may be appropriate to make one of the two substrates move toward, by deformation of the carrier, the second substrate that is held in an especially planar manner. Primarily a centric load is conceivable in particular using a pin for initiating a bonding wave that automatically propagates. This embodiment according to the invention is suitable primarily for prebonding or bonding substrates, which are to be connected to one another by a fusion-bonding process.

In a second embodiment of the process according to the invention, the two substrates are attached to one another by means of the second, above-described substrate attachment.

In a first process step, an alignment of two substrates is carried out based on their alignment markings with one another. The above remarks regarding the first embodiment of the process apply primarily for the second embodiment. While in the first embodiment, a shifting of the substrate relative to the frame that occurs after the attachment of the substrate can occur when the film is distorted by mechanical and/or thermal stress, this is virtually ruled out in the case of the second embodiment.

The second process step is carried out analogously to the first embodiment, whereby the attachment of the substrate attachments preferably to a carrier attaching area (instead of directly by making contact on a carrier attaching surface) is carried out preferably magnetically, in particular at a distance to one another.

Should the two substrates have been pre-attached to one another by a prebonding, it can be provided according to the invention to perform an additional full-surface bonding before and/or during a heat treatment in order to exert an additional, in particular full-surface and uniform, pressure loading on the two substrates. The applied force is in this case in particular greater than 100 N, preferably greater than 1 kN, even more preferably greater than 10 kN, most preferably greater than 100 kN, and all the more preferably greater than 1,000 kN. The pressures are calculated by the division of the applied force by the surface of the substrate that is to be bonded. The pressure that acts on a circular 200 mm substrate is therefore approximately 3.2 Pa bar at a pressure loading of 1 N and approximately 320,000 Pa at a pressure loading of 10 kN.

The substrate attachments can be handled with a specimen holder and/or a robot and transported between various processes and stations.

The Heat Treatment

All embodiments of the substrate attachments according to the invention are preferably suitable to withstand a heat treatment process, in particular for bonding. The first embodiment, however, can be limited by a maximum operating temperature of the carrier or the substrate attachment, in particular when the carrier is a film.

The substrates can be subjected to a heat treatment in order to provide a permanent connection (permanent bond). The bonding strength of the permanent bond is in particular greater than 1.0 J/m2, preferably greater than 1.5 J/m2, even more preferably greater than 2.0 J/m2, and most preferably greater than or equal to 2.5 J/m2. In this case, it is advantageous according to the invention when the substrates are located on the substrate attachments according to the invention. As a result, it is namely made possible to heat the substrate attachments in a mass process (batch process). The heating is preferably carried out in a continuous furnace. In the case of an alternative embodiment, the heat treatment is carried out in a module of a cluster that includes a number of modules. The bonding to a hot plate is also conceivable according to the invention. The temperature that is used in such a heat-treatment process is in particular less than 700° C., preferably less than 500° C., even more preferably less than 300° C., most preferably less than 100° C., and all the more preferably less than 50° C. In special cases, in which the attached substrates have specially prepared surfaces, the substrates can already be tightly bonded to one another when making contact at room temperature in such a way that an additional heat treatment is no longer necessary.

If the substrate attachments according to the invention have a ferromagnetic material, the Curie temperature is preferably not exceeded in order not to lose the magnetic properties of the substrate attachment according to the invention.

In another embodiment according to the invention, however, specifically the disappearance of the ferromagnetism of the substrate attachments according to the invention in the exceeding of the Curie temperature can describe another aspect according to the invention. If the bonding strength of the permanent bond between two substrates achieves its maximum only above a certain temperature, and this temperature is at least close to the Curie temperature, an automatic separation of the substrate attachments by loss of ferromagnetism can be carried out by another heating above the Curie temperature. Advantageously, the substrate holding devices according to the invention are then separated before the temperature drops below the Curie temperature again, which leads to a return of ferromagnetism, or at least are separated from one another by additional separating elements in such a way that when falling short of the Curie temperature, they at least are no longer connected to one another or at least can more easily separate. Such automatic separating processes are advantageous primarily in fully automatic batch processes.

BRIEF DESCRIPTION OF THE DRAWINGS

Further advantages, features and details of the invention follow from the subsequent description of preferred embodiments and based on the drawings; the latter show in diagrammatic view in each case.

In the figures, the same components or components with the same function are identified with the same reference numbers.

DETAILED DESCRIPTION OF THE INVENTION

Figure 1A:
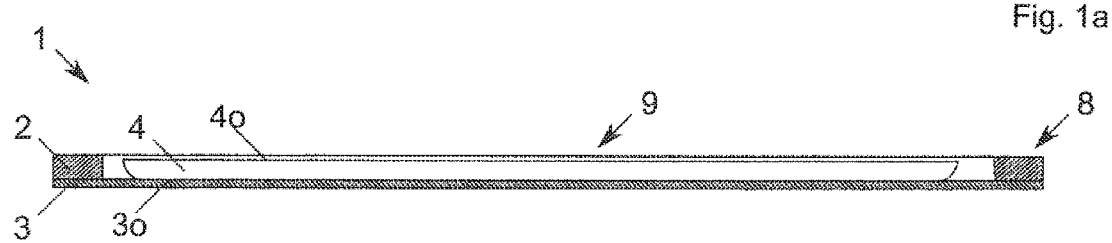
FIG. 1a a diagrammatic cross-sectional depiction, not to scale, of a first embodiment of a device according to the invention, FIG. 1b a diagrammatic cross-sectional depiction, not to scale, of a second embodiment of the device according to the invention, FIG. 2a a diagrammatic cross-sectional depiction, not to scale, of a first process step of a first embodiment of the process according to the invention, FIG. 2b a diagrammatic cross-sectional depiction, not to scale, of a second process step of the first embodiment, FIG. 2c a diagrammatic cross-sectional depiction, not to scale, of a third process step of the first embodiment, FIG. 3a a diagrammatic cross-sectional depiction, not to scale, of a first process step of a second embodiment of the process according to the invention, and FIG. 3b a diagrammatic cross-sectional depiction, not to scale, of a second process step of the second embodiment.

The first embodiment according to FIG. 1a involves a substrate attachment 1 formed from a frame 2 and a carrier 3 (here, an elastic film) that is stretched over the frame 2. It is also conceivable that the stretched carrier 3 is a very thin, but rigid plate in the unsupported state that therefore cannot be interpreted as film. The carrier 3 can then in particular also be elastically deformed by loading its carrier surface 3o. On its carrier surface 3o, the substrate attachment 1 has a substrate attaching surface 9 (or substrate attaching area) and in particular a ring-shaped carrier attaching surface 8 (or carrier attaching area) that surrounds the substrate attaching surface 9.

The frame 2 and the carrier 3 together form a receiving area for receiving an in particular thinned first substrate 4, whereby a side of the first substrate 4 facing away from the carrier 3 is preferably set back relative to the carrier attaching surface 8.

The back-thinned first substrate 4 is attached to the substrate attaching surface 9 (here a film surface) of the carrier 3 (here, an elastic film) that is stretched over the frame 2. The carrier surface 3o is adhesive for attaching the first substrate 4 and for attaching the carrier 3 to the frame 2.

Figure 1B:
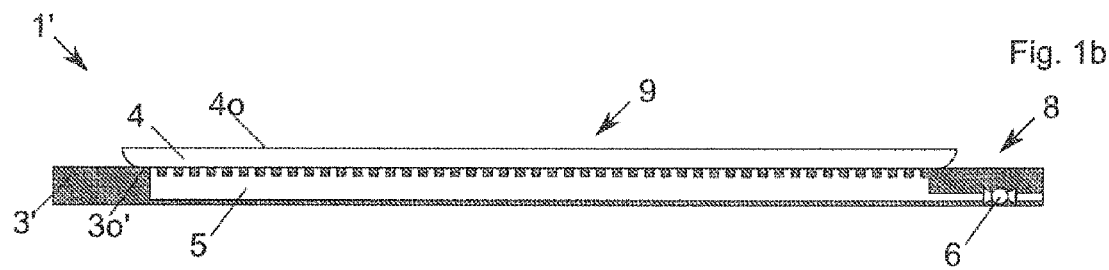

In the embodiment according to FIG. 1b, an in particular monolithic substrate attachment 1' is shown. The latter has a rigid carrier 3' with a carrier surface 3o', which has a vacuum attachment as an attaching element 5.

The attaching element 5 can have vacuum strips (as shown); instead of this, however, it can also have electrostatic attachments, magnetic attachments, adhesive surfaces, or mechanical clamps. In particular, the attaching elements 5 also act over wide distances/long times in the case of a transport of the carrier 3'. When using a vacuum for attaching the first substrate 4, the vacuum can be maintained within a vacuum chamber and/or the vacuum strips by closing a valve 6. In the case of other attachments according to the invention, the valve 6 can be interpreted in general as a control unit that is controlled via a control system. Instead of this, a feed line for electric current would a feed line for electric current would also be conceivable in the case of an electrostatic and/or magnetic attachment.

The layer thickness of the thinned first substrate 4 is small so that a stabilization of the first substrate 4 by a carrier 3, 3' according to the invention is advantageous in order to avoid damage to the first substrate 4.

What is stated above for the first substrate analogously applies for a second substrate 4' or other substrates if the latter are designed identically. Combinations of the described substrate attachments 1, 1' can also be used for the second or other substrates.

In the following figures, the process according to the invention is explained based on two examples, whereby the substrates that are to be bonded (first, second, and some other substrates) and substrate attachments are designed identically in each case. It is conceivable according to the invention to use different substrate attachments and/or substrates for the first substrate 4 and the second substrate 4' or other substrates.

Figure 2A:

FIG. 2a shows an alignment process in which the two substrates 4, 4' are attached in each case to carriers 3 of the substrate attachments 1 that are arranged on opposite sides and are aligned with one another. The alignment is preferably carried out via an alignment unit (aligner), not shown. The alignment is carried out in a way that is known in the art, preferably between corresponding alignment markings on the substrate surfaces 4o, 4o' of the substrates 4, 4'.

Since the alignment is carried out on alignment markings of the substrates 4, 4', the substrate attachments 1 can be shifted toward one another. This shifting is normally marginal and negligible, however. In particular, the shifting according to the invention is less than 5 mm, preferably less than 1 mm, even more preferably less than 100 µm, most preferably less than 10 µm, and all the more preferably less than 1 µm. In this connection, it is decisive that the corresponding carrier attaching areas or carrier attaching surfaces 8 lie opposite one another in such a way that an adequate transfer of force for mutual attachment of the substrate attachments 1 is made possible.

Figure 2B:

FIG. 2b shows a contacting process, in which the surfaces 2o (carrier attaching surfaces 8) of the two frames 2 make contact with one another. The two frames 2 are directly attached to one another in particular by inherent magnetic forces (depicted by magnetic field lines 7). It is also conceivable that the substrate surfaces 4o lie above the surfaces 2o. In this case, the substrate surfaces 4o make contact before the surfaces 2o. The surfaces 2o are independently drawn to one another, in particular by magnetic forces.

Figure 2C:
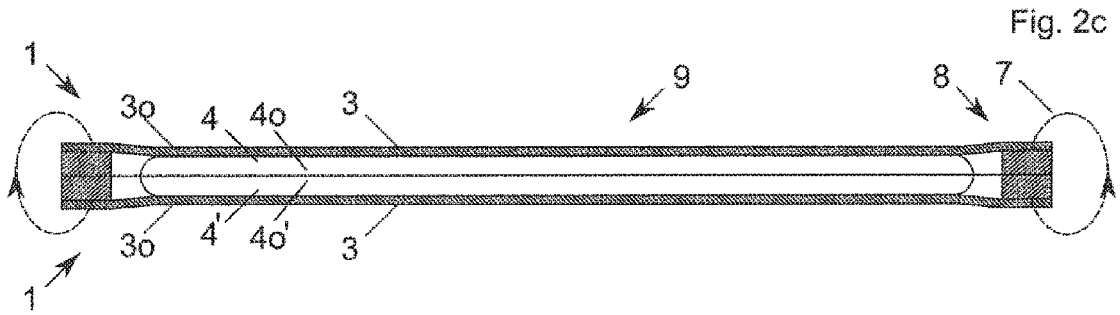

In the process step according to FIG. 2c, a contact between the two substrates 4, 4' takes place. The making of contact can be done by any elements that impose force on the substrates 4, 4' in opposite directions, in particular by centric and radially-symmetric pressure elements or by rollers. By imposing force, the elastic carrier 3 is expanded in the direction of the opposite carrier 3. In particular, it is conceivable, as depicted, to deform both carriers 3 against one another. If the substrate surfaces 4o project over the surfaces 2o, a contact of the outer frame 2 is carried out in this process step. In particular in the case of the magnetic frames, the making of contact is done independently by their magnetic attraction.

Figure 3A:
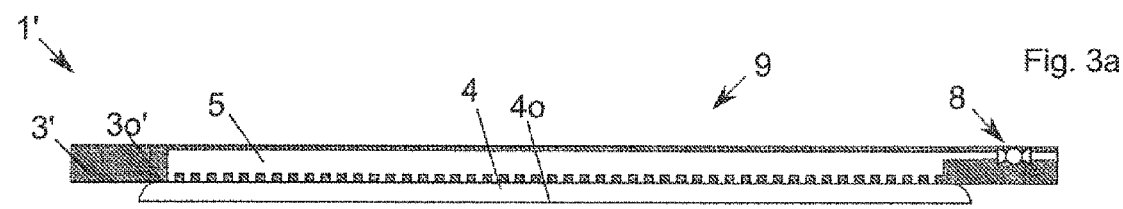

In FIG. 3a, an alignment process is shown analogously to FIG. 2a with substrate attachments 1' according to FIG. 1b.

Figure 3B:
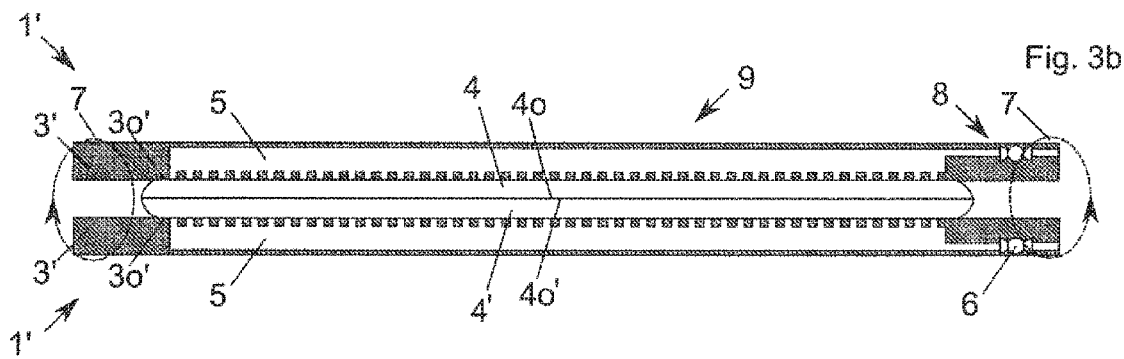

In FIG. 3b, a contacting process is depicted, in which the substrate surfaces 4o, 4o' of the two substrates 4, 4' make contact with one another before the substrate attachments 1' can come into contact. In this embodiment, the substrate attachments 1' therefore operate without contact. The thus formed substrate stack is attached in particular by inherent magnetic forces of the carrier 3'.

According to the invention, at least one of the two substrates 4, 4' is a thinned substrate 4, 4'. The bonding process is thus no longer limited to the use of thick, dimensionally-stable substrates.

LIST OF REFERENCE SYMBOLS 1, 1' Substrate attachment
2 Frame
2o Surface
3, 3' Carrier
3o, 3o' Carrier surface
4, 4' Substrate
4o, 4o' Substrate surface
5 Attaching element, in particular vacuum attachment
6 Control unit, in particular valve
7 Magnetic field lines
8 Carrier attaching area/carrier attaching surface
9 Substrate attaching surface Having described the invention, the following is claimed:

1. A method for bonding a first substrate to a second substrate, the method comprising:
    thinning the first substrate and/or the second substrate;
    prior to or after the thinning, fixing the first substrate and/or the second substrate to surfaces of respective elastically deformable carriers; and
    after the fixing and the thinning, bonding the first substrate to the second substrate by deforming at least one of the carriers,
    wherein a frame is disposed on each of the carrier surfaces,
    wherein an upper surface of the frame defines a carrier attaching surface,
    wherein each of the fixed first and/or second substrates has a side that faces away the carrier surface, and
    wherein, relative to the carrier surface, a height of the side of the fixed first and/or second substrates is less than a height of the carrier attaching surface.

2. The method according to claim 1, wherein, during the thinning, the first substrate and/or the second substrate is/are thinned to a thickness of less than 1,000 μm.

3. The method according to claim 1, wherein the first substrate and the second substrate are at least partially congruent in shape and/or have similar geometric dimensions.

4. The method according to claim 1, further comprising:
    aligning the first substrate and the second substrate with one another before the bonding, said aligning based on corresponding alignment markings of the first and second substrates; and
    pre-attaching the first substrate to the second substrate after the aligning and before the bonding.

5. The method according to claim 1, wherein said elastically deformable carriers are respectively included in substrate attachments to which said first substrate and/or said second substrate are respectively attached prior to or after the thinning, and
    wherein the substrate attachments respectively have substrate attaching surfaces, the substrate attaching surfaces being configured to respectively attach said first and/or second substrates, and
    wherein said carrier attaching surfaces respectively surround the substrate attaching surfaces, said carrier attaching surfaces being configured to mutually attach the substrate attachments.

6. The method according to claim 1, wherein the carrier attaching surfaces are magnetized.

7. The method according to claim 1, wherein said carriers are respectively attached to ring-shaped frames.

8. The method according to claim 3, wherein the first substrate and the second substrate are congruent in shape at least in relation to a cross-sectional surface that is parallel to a bonding surface of each of the first and second substrates.

9. The method according to claim 4, wherein the aligning of the first and second substrates is to an alignment accuracy of greater than 100 μm.

10. The method according to claim 4, wherein the pre-attaching of the first substrate to the second substrate is performed magnetically.

11. The method according to claim 1, wherein the carriers are respectively stretched over frames of substrate attachments that respectively comprise said carriers.

12. The method according to claim 1, wherein the carriers are respectively comprised of elastic films.

13. The method according to claim 1, wherein the bonding comprises applying a centrically-oriented pressure to at least one of the carriers to respectively bring at least one of the thinned and fixed substrates toward another one of the thinned and fixed substrates, the applying of the pressure serving to deform the at least one of the carriers.

14. The method according to claim 13, wherein the centrically-oriented pressure is applied by pins.

15. The method according to claim 13, wherein the centrically-oriented pressure is applied by mandrels.

* * * * *